United States Patent
Kim et al.

(10) Patent No.: US 8,416,631 B2
(45) Date of Patent: Apr. 9, 2013

(54) INTERNAL VOLTAGE GENERATOR CIRCUIT AND SEMICONDUCTOR MEMORY DEVICE USING THE SAME

(75) Inventors: Young-Hoon Kim, Seoul (KR); Nam-Jong Kim, Suwon-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 219 days.

(21) Appl. No.: 12/874,299

(22) Filed: Sep. 2, 2010

(65) Prior Publication Data

US 2011/0051533 A1  Mar. 3, 2011

(30) Foreign Application Priority Data

Sep. 3, 2009  (KR) .................. 10-2009-0083098

(51) Int. Cl.
*G11C 5/14* (2006.01)
(52) U.S. Cl.
USPC ............... 365/189.09; 365/100; 365/189.07; 365/226; 365/227
(58) Field of Classification Search .............. 365/100, 365/189.07, 189.09, 226, 227
See application file for complete search history.

(56) References Cited

U.S. PATENT DOCUMENTS

| | | | | |
|---|---|---|---|---|
| 6,661,712 B2 * | 12/2003 | Hiraki et al. | ............ | 365/189.05 |
| 6,958,947 B2 * | 10/2005 | Park et al. | ............ | 365/228 |
| 2008/0055991 A1 * | 3/2008 | Kim et al. | ............ | 365/185.11 |

FOREIGN PATENT DOCUMENTS

| | | |
|---|---|---|
| KR | 1020040082894 A | 9/2004 |
| KR | 1020050070279 A | 7/2005 |
| KR | 1020050101682 A | 10/2005 |

* cited by examiner

*Primary Examiner* — Pho M Luu
*Assistant Examiner* — Thao Bui
(74) *Attorney, Agent, or Firm* — Muir Patent Consulting, PLLC

(57) ABSTRACT

An internal voltage generator circuit is disclosed. The internal voltage generator circuit includes a comparator configured to compare a first voltage with a reference voltage and to output a comparison signal. The circuit further includes an internal voltage driver configured to receive an external voltage and the comparison signal and to output an internal voltage at an internal voltage output terminal, based on the comparison signal. The circuit further includes a voltage divider circuit including first and second resistor units and a first voltage output terminal between the first and second resistor units, configured to receive the internal voltage, and configured to output the first voltage based on the resistance values of the first and second resistor units, the first and second resistor units connected in series, and the first voltage being output through the first voltage output terminal. The circuit further includes a control signal generator circuit configured to generate at least one resistor control signal for controlling the resistance value of the first resistor unit and at least one resistor control signal for controlling the resistance value of the second resistor unit, on the basis of the comparison signal and a precharge command.

20 Claims, 14 Drawing Sheets

INTERNAL VOLTAGE GENERATOR CIRCUIT AND SEMICONDUCTOR MEMORY DEVICE USING THE SAME

CROSS-REFERENCE TO RELATED APPLICATIONS

This U.S. non-provisional patent application claims the benefit of Korean Patent Application 10-2009-0083098, filed on Sep. 3, 2009, in the Korean Intellectual Property Office, the entire contents of which are incorporated herein by reference.

BACKGROUND

1. Field

Example embodiments described in this application relate to a semiconductor memory device, and in particular, to an internal voltage generator circuit for a semiconductor integrated circuit device.

2. Description of the Related Art

A general semiconductor memory device includes at least one memory cell array and each memory cell array includes a plurality of memory cells. A user can designate specific row and column addresses to thereby access memory cells. If row and column address are designated, corresponding memory cells are selected. In a read mode, data stored in the selected memory cells are output, and in a write mode, data are recorded in the selected memory cells. In the read mode, sense amplifiers are activated to sense the data in the selected memory cells and to output the sensed data as an output signal. This output signal may be transmitted to other circuits in the semiconductor memory device and finally to an external apparatus having requested the data. Examples of the external apparatus include a data processing system or a data operating system.

If a data read command is input to the semiconductor memory device, data in a memory cell corresponding to input addresses is input to input terminals of a sense amplifier through a bit line and a complementary bit line. When a first internal voltage is applied, the sense amplifier senses and amplifies a voltage difference between the input terminals and then outputs the data through I/O lines. Thereafter, when a second internal voltage is applied, the sense amplifier restores the sensed data in the memory cell through the bit line and the complementary bit line. However, in an early sensing operation, since a number of bit lines should be charged, a large amount of current is consumed. Therefore, a rapid drop in an internal array voltage VINTA may occur. Moreover, after charging the bit lines, the internal array voltage should be constantly maintained; however, it may be deviated from a reference voltage. Such a rapid drop in the internal array voltage and a difference between the internal array voltage and the reference voltage may degrade the performance of the semiconductor memory device.

SUMMARY

Example embodiments provide an internal voltage generator circuit capable of controlling a variation in the level of an internal array voltage by controlling a resistance ratio between a first resistor unit and a second resistor unit constituting a voltage divider circuit.

Example embodiments provide an internal voltage generator circuit capable of maintaining an internal array voltage constantly after charging bit lines are completed.

Example embodiments provide a semiconductor memory device employing an internal voltage generator circuit capable of controlling a variation in the level of an internal array voltage.

According to one embodiment, an internal voltage generator circuit is disclosed. The internal voltage generator circuit includes a comparator configured to compare a first voltage with a reference voltage and to output a comparison signal. The circuit further includes an internal voltage driver configured to receive an external voltage and the comparison signal and to output an internal voltage at an internal voltage output terminal, based on the comparison signal. The circuit further includes a voltage divider circuit including first and second resistor units and a first voltage output terminal between the first and second resistor units, configured to receive the internal voltage, and configured to output the first voltage based on the resistance values of the first and second resistor units, the first and second resistor units connected in series, and the first voltage being output through the first voltage output terminal. The circuit further includes a control signal generator circuit configured to generate at least one resistor control signal for controlling the resistance value of the first resistor unit and at least one resistor control signal for controlling the resistance value of the second resistor unit, on the basis of the comparison signal and a precharge command.

In another embodiment, a semiconductor memory device is disclosed. The semiconductor memory device includes a memory cell array, a controller configured to output a precharge command, and an internal voltage generator circuit configured to receive an external voltage and to output an internal voltage. The internal voltage generator further comprises a comparator configured to compare a first voltage with a reference voltage and to output a comparison signal; an internal voltage driver configured to receive the external voltage and the comparison signal and to output the internal voltage through an internal voltage output terminal to the memory cell array, based on the comparison signal; a voltage divider circuit including first and second resistor units and a first voltage output terminal between the first and second resistor units, configured to receive the internal voltage, and configured to output the first voltage based on the resistance values of the first and second resistor units, the first and second resistor units connected in series, and the first voltage being output through the first voltage output terminal; and a control signal generator circuit configured to generate at least one resistor control signal for controlling the resistance value of the first resistor unit and at least one resistor control signal for controlling the resistance value of the second resistor unit, on the basis of the comparison signal and a precharge command.

In a further embodiment, a method of controlling an internal voltage supplied to a circuit element in a semiconductor device is disclosed. The method includes comparing a reference voltage to a voltage divider output voltage, and based on the comparison, outputting a comparison signal to control the internal voltage. Furthermore, during a first operational cycle of the semiconductor device, a voltage divider circuit is set to output a voltage divider output voltage based on an initial predetermined voltage divider resistance ratio, and during at least one operation cycle subsequent to the first operational cycle of the semiconductor device, the voltage divider circuit is set to output a voltage based on an adjusted voltage divider resistance ratio different from the initial predetermined voltage divider resistance ratio.

Moreover, the internal array voltage can be constantly maintained after charging of bit lines is completed, thereby improving the performance of the semiconductor memory device.

BRIEF DESCRIPTION OF THE DRAWINGS

The above and other features and advantages will become more apparent by describing in detail example embodiments thereof with reference to the attached drawings in which.

DETAILED DESCRIPTION

Figure 1:
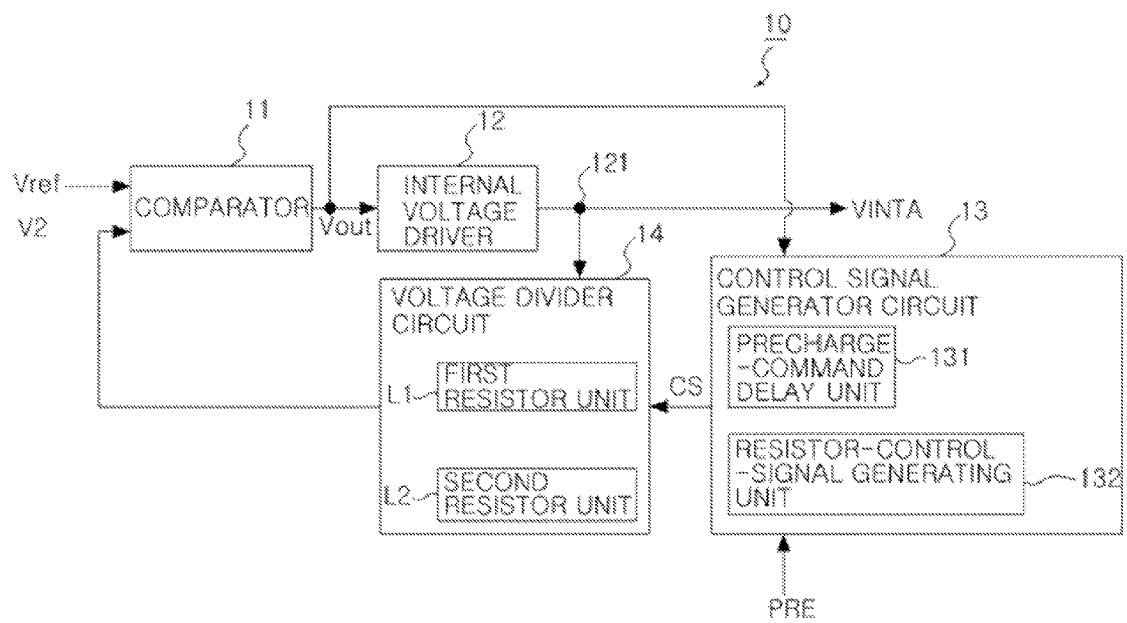
FIG. 1 is a block diagram schematically illustrating an internal voltage generator circuit according to one embodiment.

Example embodiments will now be described more fully with reference to the accompanying drawings.

Specific structural and functional details disclosed herein are merely representative for purposes of describing example embodiments. Example embodiments may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second and third may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

FIG. 1 is a block diagram schematically illustrating an internal voltage generator circuit according to one example embodiment.

As shown in FIG. 1, an internal voltage generator circuit 10 according to a first example embodiment may include a comparator 11, an internal voltage driver 12, a control signal generator circuit 13, and a voltage divider circuit 14. The voltage divider circuit 14 may include a first resistor unit L1 and a second resistor unit L2 which are connected in series between an output terminal of the internal voltage driver 12 and a ground terminal. The resistance value of the first resistor unit L1 and the resistance value of the second resistor unit L2 may be variable.

The comparator 11 may compare two input voltage values and output the result as a comparison signal Vout to the internal voltage driver 12. A reference voltage Vref may be applied to a first input terminal of two input terminals of the comparator 11.

The internal voltage driver 12 may receive an external voltage and output at an internal voltage output terminal 121 an internal array voltage VINTA based on the comparison signal Vout from the comparator 11.

In order to control the level of the internal array voltage VINTA, the comparison signal Vout of the comparator 11 may be used. In order to control the comparison signal Vout of the comparator 11, a second voltage V2 applied to a second input terminal of the comparator 11 may be controlled. Without control signal generator circuit 13 or voltage divider circuit 14, VINTA could be controlled simply by a loop including comparator 11 having inputs Vref and V2 and having output Vout input into internal voltage driver 12, which could output V2. However, the control signal generator circuit 13 and the voltage divider circuit 14 may be used to permit greater control of the second voltage V2 and thus VINTA.

In one embodiment, the control signal generator circuit 13 may include a precharge-command delay unit 131 and a resistor-control-signal generating unit 132.

After an external voltage is applied to precharge-command delay unit 131, during one or more operation cycles (e.g., periods including a precharge command), the precharge-command delay unit 131 may temporarily store a precharge command PRE and output an inverted delayed precharge command PREDB and a non-inverted delayed precharge command PRED to the resistor-control-signal generating unit 132. In each operation cycle, the resistor-control-signal generating unit 132 may detect the comparison signal Vout output from the comparator 11 on the basis of the inverted delayed precharge command PREDB and the non-inverted delayed precharge command PRED. Then, the resistor-control-signal generating unit 132 may generate resistor control signals CS for controlling the first resistor unit L1 and the second resistor unit L2 on the basis of the comparison signal Vout, and output the resistor control signals CS to the voltage divider circuit 14.

In the voltage divider circuit 14, the resistance value of the first resistor unit L1 and the resistance value of the second resistor unit L2 may be determined by the resistor control signals CS. The first resistor unit L1 may serve as a pull-up resistor and the second resistor unit L2 may serve as a pull-down resistor. The internal array voltage VINTA output from the internal voltage driver 12 may be applied to the voltage divider circuit 14. The voltage divider circuit 14 may output the second voltage V2 which is a fraction of the internal voltage based on the resistance ratio between the first resistor unit L1 and the second resistor unit L2.

The second voltage V2 may be applied to the second input terminal of the comparator 11.

According to the above-mentioned configuration, on the basis of the level of the internal array voltage VINTA at one or more predetermined time points, the level of the internal array voltage VINTA to be output can be controlled.

The configuration of the control signal generator circuit 13 and the voltage divider circuit 14 of the internal voltage generator circuit 10 may depend on a number of operation cycles desired to occur with VINTA remaining either above or below a desired value before the voltage divider circuit 14 is changed. That is, control signal generator circuit 13 and voltage divider circuit 14 may be configured so that initially, V2 is controlled based on an initial voltage control setting (e.g., initial resistance of first resistor unit L1 and second resistor unit L2), but after a number of operation cycles during which Vout consecutively increases or decreases, the voltage divider 14 is adjusted based on control signals.

Examples of the internal voltage generator circuit 10 based on the number of desired operation cycles after which the resistances of resistors in a voltage divider circuit are changed, thereby altering the effects on V2, will now be described particularly but not exclusively.

According to one embodiment, after the external voltage is applied, the level of the internal array voltage VINTA is controlled on the basis of the comparison signal Vout and a precharge signal PRE.

Figure 2:
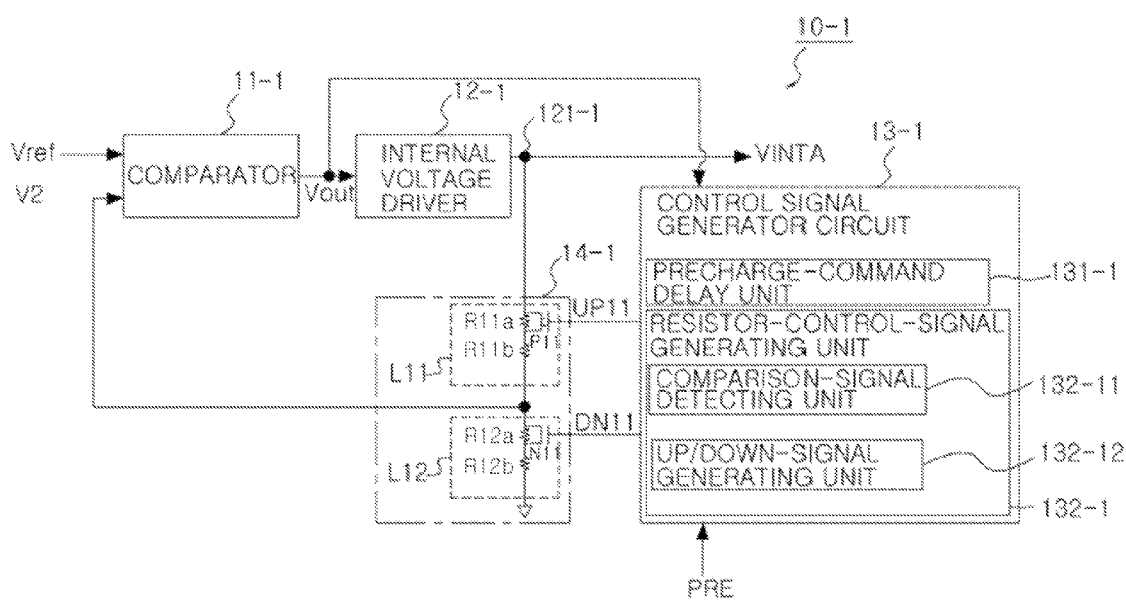
FIG. 2 is a block diagram schematically illustrating an example of the internal voltage generator circuit according to another example embodiment.

FIG. 2 is a diagram illustrating an internal voltage generator circuit 10-1 according to one embodiment. The configuration of the internal voltage generator circuit 10-1 is similar to that of the internal voltage generator circuit 10 according to the example embodiment shown in FIG. 1 except that a comparator 11-1 is substituted for comparator 11, an internal voltage driver 12-1 is substituted for internal voltage driver 12, a control signal generator circuit 13-1 is substituted for the control signal generator circuit 13, and a voltage divider circuit 14-1 is substituted for the voltage divider circuit 14.

Referring to FIG. 2, comparator 11-1 may compare V2 and Vref and output Vout based on the comparison. For example, if V2 is greater than Vref, then Vout may be increased (e.g., output as a higher voltage level than in the previous loop), which causes VINTA output from internal voltage driver 12-1 to decrease (e.g., output a lower VINTA than in the previous loop). Conversely, if V2 is less than Vref, then Vout may decrease, which causes internal voltage driver 12-1 to output a higher VINTA than in the previous loop. Comparator 11-1 and internal voltage driver 12-1 may be comprised of digital and/or analog components to implement the functionality described above.

Referring to FIG. 2, a first resistor unit L11 of the voltage divider circuit 14-1 includes a first PMOS transistor P11 a first resistor R11a, and a second resistor R11b. The first PMOS transistor P11 and the first resistor R11a are connected in parallel and the second resistor R11b is connected in series with the parallel first PMOS transistor P11 and first resistor R11a, between the output terminal 121-1 of the internal voltage driver 12 and an output terminal of the voltage divider circuit 14-1. The second resistor unit L12 includes a first NMOS transistor N11, a third resistor R12a, and a fourth resistor R12b. The first NMOS transistor N11 and the third resistor R12a are connected in parallel and the fourth resistor R12b is connected in series with the parallel first NMOS transistor N11 and third resistor R12a, between the output terminal of the voltage divider circuit 14-1 and the ground terminal. In this example, at least one of the first through fourth resistors may be omitted.

The control signal generator circuit 13-1 includes a precharge-command delay unit 131-1 and a resistor-control-signal generating unit 132-1, and the resistor-control-signal generating unit 132-1 includes a comparison-signal detecting unit 132-11 and an up/down-signal generating unit 132-12. In this example, the control signal generator circuit 13-1 generates a first pull-up signal UP11 and a first pull-down signal DN11 as the resistor control signals CS. The first pull-up signal UP11 is applied to a gate of the first PMOS transistor P11 of the first resistor unit L11 and the first pull-down signal DN11 is applied to a gate of the first NMOS transistor N11 of the second resistor unit L12.

The resistance value of the first resistor unit L11 and the resistance value of the second resistor unit L12 are determined on the basis of the first pull-up signal UP11 and the first pull-down signal DN11. As a result, the second voltage V2 to be output from the voltage divider circuit 14-1 is determined. The level of the internal array voltage VINTA to be output from the internal voltage driver 12 rises or drops on the basis of the second voltage V2.

Figure 3:
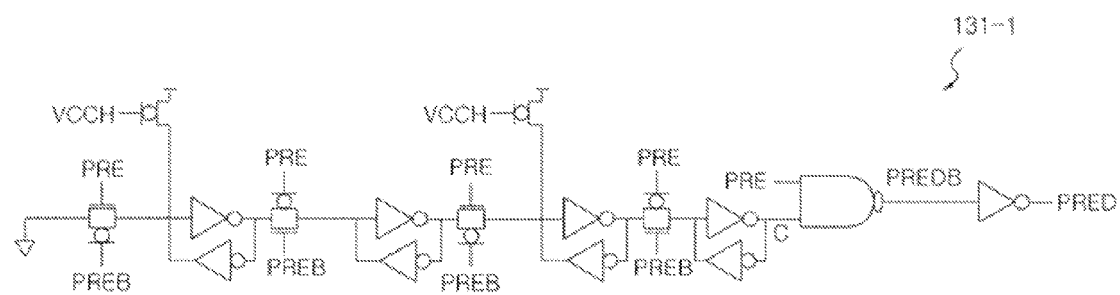
FIG. 3 is a circuit diagram illustrating an example of a precharge-command delay unit shown in FIG. 2, according to one embodiment.

The operation of the control signal generator circuit 13-1 for generating the first pull-up signal UP11 and the first pull-down signal DN11 will now be described with reference to FIGS. 3 to 5.

The control signal generator circuit 13-1 receives a precharge command PRE and receives the comparison signal Vout from the comparator 11 (See FIG. 2). Specifically, after the external voltage is applied, during each of two operation cycles, the precharge command PRE is applied to the precharge-command delay unit 131-1 of the control signal generator circuit 13-1. The precharge-command delay unit 131-1 temporarily stores the precharge command PRE and outputs the inverted delayed precharge command PREDB and the non-inverted delayed precharge command PRED to the resistor-control-signal generating unit 132-1. An example of the precharge-command delay unit 131-1 is shown in FIG. 3.

In one embodiment, after the external voltage is applied, VCCH is briefly and temporarily set at a low level and the PRE signal is also at a low level. As such, the level of a signal on a node C of FIG. 3 is initially at a high level. However, after two operation cycles end (e.g., after two precharge commands are applied), and continuing thereafter, the level of the signal on a node C transitions to a low level. Therefore, the inverted delayed precharge command PREDB and the non-inverted delayed precharge command PRED are prevented from toggling thereafter.

The comparison-signal detecting unit 132-11 of the control signal generator circuit 13-1 receives the comparison signal Vout and based on Vout and the state of the precharge command delay unit 131-1, outputs pull-up detection signals PUP11 and PUP12 and pull-down detection signals PDN11 and PDN12. An example of the comparison-signal detecting unit 132-11 is shown in FIG. 4.

Hereinafter, for ease of explanation, two operation cycles after the external voltage is applied (e.g., two precharge cycles in the case of DRAM) are referred to as a first operation cycle and a second operation cycle in order of time. In FIG. 4, in one embodiment, during a first operation cycle, a first pull-up detection signal PUP11 and a first pull-down detection signal PDN11 represent an inverted signal of the comparison signal Vout detected on the basis of the precharge command PRE applied in the first operation cycle. Similarly, during a second operation cycle, a second pull-up detection signal PUP12 and a second pull-down detection signal PDN12 represent an inverted signal of the comparison signal Vout detected on the basis of the precharge command PRE applied in the second operation cycle. For example, in one embodiment, PUP11 and PDN11 may represent an inverted signal of Vout during the first operation cycle and thereafter, and PUP12 PDN12 may represent an inverted signal of Vout during the second operation cycle and thereafter.

Figure 4:
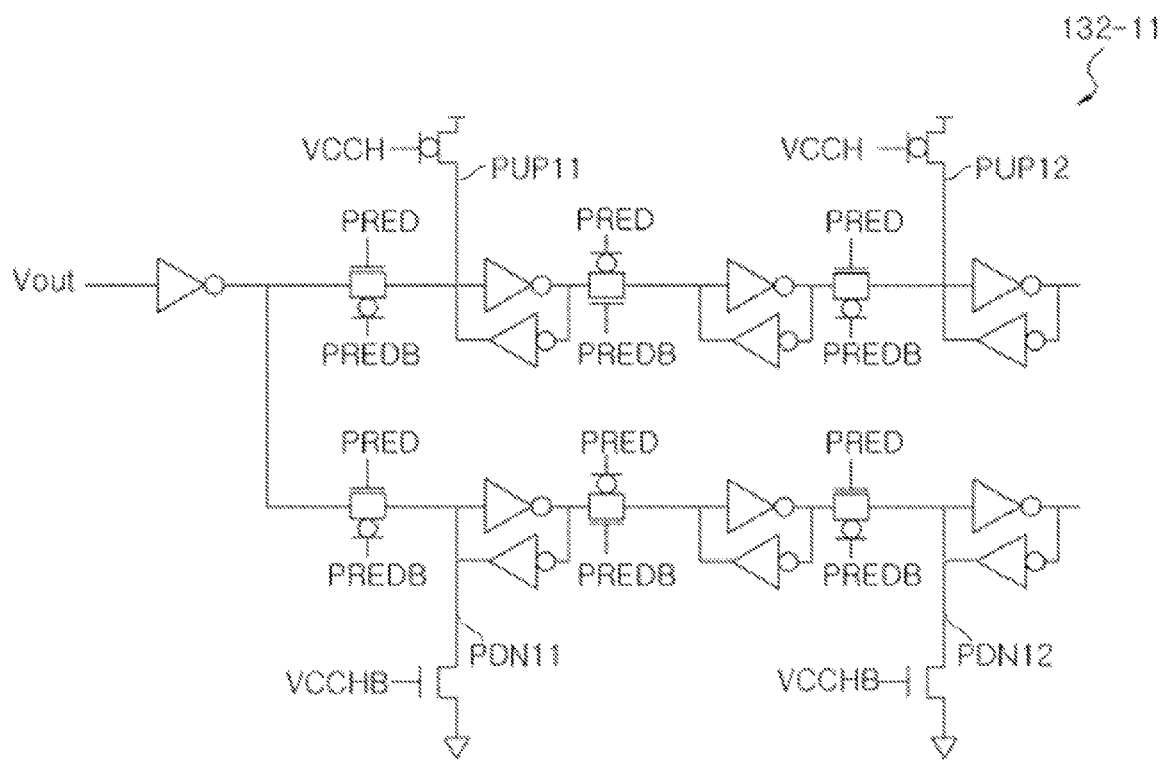
FIG. 4 is a circuit diagram illustrating an example of a comparison-signal detecting unit shown in FIG. 2, according to one embodiment.

As shown in FIG. 4, PMOS transistors are connected between an external voltage application terminal and output terminals of the first pull-up detection signal PUP11 and the second pull-up detection signal PUP12. When the external voltage is initially applied, a first signal VCCH applied to gates of the PMOS transistors transitions from a high level to a low level and temporarily remains at a low level to temporarily turn on the PMOS transistors so that the first and second pull-up detection signals PUP11 and PUP12 have first initial high values. Moreover, NMOS transistors are connected between a ground terminal and output terminals of the first pull-down detection signal PDN11 and the second pull-down detection signal PDN12. A second signal VCCHB is applied to gates of the NMOS transistors and has an opposite level to the first signal VCCH. Therefore, when the external voltage is initially applied, the second signal VCCHB transitions from a low level to a high level and temporarily remains at a high level to temporarily turn on the NMOS transistors so that the first pull-down detection signal PDN11 and the second pull-down detection signal PDN12 have second initial low values.

The up/down-signal generating unit 132-12 generates the first pull-up signal UP11 and the first pull-down signal DN11 by using the first and second pull-up detection signals PUP11 and PUP12 and the first and second pull-down detection signals PDN11 and PDN12.

The up/down-signal generating unit 132-12 may be configured to output resistor control signals CS to lower the level of the internal array voltage VINTA when both of the first pull-up detection signal PUP11 and the second pull-up detection signal PUP12 have the low level (i.e., UP11 is low), and to output resistor control signals CS to raise the level of the internal array voltage VINTA to be output from the internal voltage driver 12 when both of the first pull-down detection signal PDN11 and the second pull-down detection signal PDN12 have the high level (i.e., DN11 is high).

Figure 5:
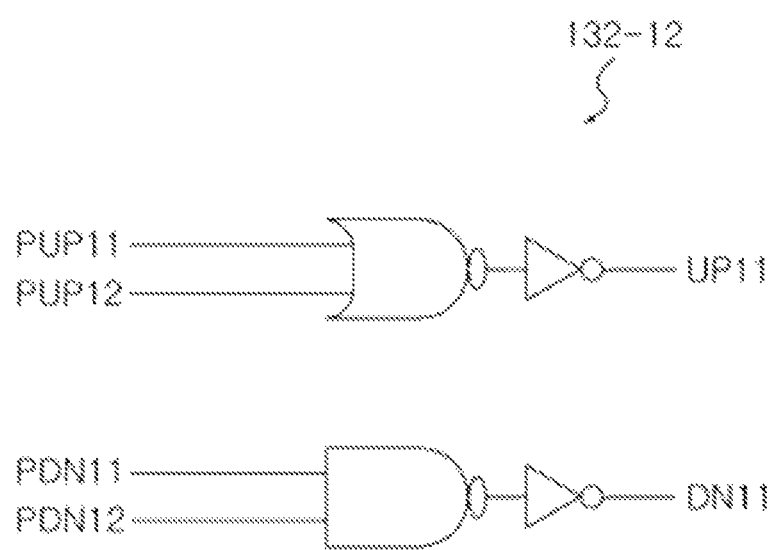
FIG. 5 is a circuit diagram illustrating an example of the up/down-signal generating unit shown in FIG. 2, according to one embodiment.

FIG. 5 is a circuit diagram illustrating an example of the up/down-signal generating unit 132-12. The up/down-signal generating unit 132-12 having a configuration shown in FIG. 5 receives the first and second pull-up detection signals PUP11 and PUP12 and the first and second pull-down detection signals PDN11 and PDN12 and outputs the first pull-up signal UP11 and the first pull-down signal DN11.

When all of the first and second pull-up detection signals PUP11 and PUP12, and the first and second pull-down detection signals PDN11 and PDN12, have a low level, both of the first pull-up signal UP11 and the first pull-down signal DN11 have a low level. Therefore, a first PMOS transistor P11 of a first resistor unit L11 is turned on and a first NMOS transistor N11 of the second resistor unit L12 is turned off. As a result, V2 increases, which causes Vout to increase, and the level of the internal array voltage VINTA to be output from the internal voltage driver 12 drops.

When all of the first and second pull-up detection signal PUP11 and PUP12 and the first and second pull-down detection signals PDN11 and PDN12 have a high level, both of the first pull-up signal UP11 and the first pull-down signal DN11 have a high level. Therefore, the first NMOS transistor N11 of the second resistor unit L12 is turned on and the first PMOS transistor P11 of the first resistor unit L11 is turned off. As a result, V2 decreases, which causes Vout to decrease, and the level of the internal array voltage VINTA to be output from the internal voltage driver 12 rises.

In one embodiment, initially, the first pull-up detection signal PUP11, the second pull-up detection signal PUP12, the first pull-down detection signal PDN11, and the second pull-down detection signal PDN12 have initial values such that the first pull-up signal UP11 has a high level and the first pull-down signal DN11 has a low level. As such, initially, both transistor P11 and transistor N11 are off and V2 depends on the values of R11a, R11b, R12a, and R12b.

The configuration of the control signal generator circuit 13-1 of the internal voltage generator circuit 10-1 according to the first example shown in FIG. 2 may be partially modified such that the internal voltage generator circuit 10-1 is applicable to a case where during the first operational cycle, the resistance values of the resistor units L11 and/or L12 may be altered to affect a change in V2 and Vout. In this case, the precharge-command delay unit 131-1 may be configured to temporarily store the precharge command PRE for one operation cycle after the external voltage is applied, and to output the inverted delayed precharge command PREDB and the non-inverted delayed precharge command PRED. Moreover, the resistor-control-signal generating unit 132-1 may detect the comparison signal Vout when the non-inverted delayed precharge command PRED is activated, and output the inverted signal of the comparison signal Vout as the pull-up detection signal PUP11 and the pull-down detection signal PDN11.

In one embodiment, the circuit of FIG. 2 operates as follows. The signals UP11 and DN11 are initially set such that both of transistors P11 and N11 are off, and voltage divider circuit 14-1 is set to an initial setting where each resistor unit L11 and L12 has a set resistance based on resistors R11a, R11b, R12a, and R12b without variation based on any transistors. As such, the loop including comparator 11-1, internal voltage divider 12-1, and voltage divider circuit 14-1 functions to set VINTA to a target value. That is, if VINTA is higher than desired, then V2 increases compared to Vref, which causes Vout to increase, thereby decreasing VINTA in the next loop. Conversely, if VINTA is lower than desired, then V2 decreases compared to Vref, which causes Vout to decrease, thereby increasing VINTA in the next loop. Thus, VINTA can remain stable around a desired voltage.

However, in a situation where VINTA remains higher or lower than desired for more than one loop (e.g., two operational cycles), Vout increases or decreases for two or more consecutive loops. In this situation, the UP11 and DN11 values may change in the manner described above, so as to affect the resistance of resistor units L11 and/or L12 and cause voltage divider circuit 14-1 to output a different output voltage as V2. That is, in one situation, where VINTA remains higher than desired for more than one consecutive operational cycle and Vout increases for two or more operational cycles, then the signals UP11 and DN11 change in order to increase the voltage level V2 (e.g., UP11 may cause transistor P11 to turn on), such that Vout increases even greater than in the last loop, which decreases VINTA even faster, thereby reducing the number of loops and the amount of time necessary for VINTA to reach its desired value. An opposite procedure occurs if VINTA remains lower than desired for more than one consecutive operational cycle.

According to another embodiment, the voltage divider circuit is adjusted after three operation cycles after the external voltage is applied and the level of the internal array voltage VINTA is controlled on the basis of the comparison signal Vout.

Figure 6:
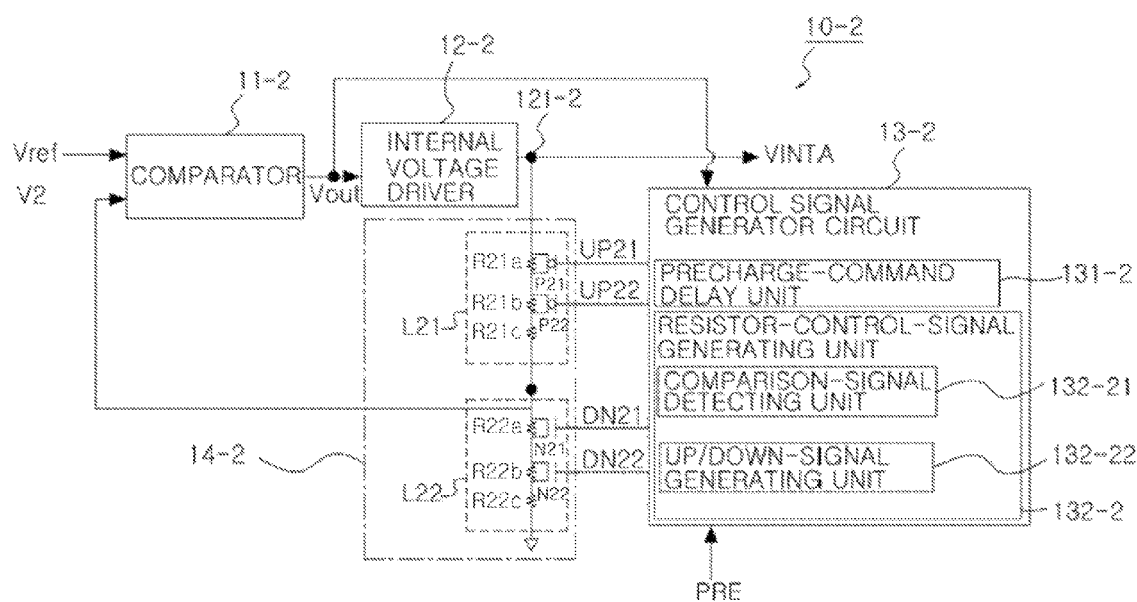
FIG. 6 is a block diagram illustrating another exemplary internal voltage generator circuit according to one embodiment.

FIG. 6 is a diagram illustrating an internal voltage generator circuit 10-2 according to one embodiment. The configuration of the internal voltage generator circuit 10-2 is similar to that of the internal voltage generator circuit 10 according to the example embodiment shown in FIG. 1 except that a comparator 11-2 is substituted for comparator 11, an internal voltage driver 12-2 is substituted for internal voltage driver 12, a control signal generator circuit 13-2 is substituted for the control signal generator circuit 13 and a voltage divider circuit 14-2 is substituted for the voltage divider circuit 14.

Referring to FIG. 6, a first resistor unit L21 of the voltage divider circuit 14-2 may include a first PMOS transistor P21, a second PMOS transistor P22, a first resistor R21a, a second resistor R21b, and a third resistor R21c. The first PMOS transistor P21 is connected in parallel with the first resistor R21a, which are connected in series with the second PMOS transistor P22 connected in parallel with the second resistor R21b, which are connected in series with the first resistor R21, between the output terminal 121-2 of the internal voltage driver 12 and an output terminal of the voltage divider circuit 14-2. The second resistor unit L22 may include a first NMOS transistor N21, a second NMOS transistor N22, a fourth resistor R22a, a fifth resistor R22b, and a sixth resistor R22c. The first NMOS transistor N21 is connected in parallel with the fourth resistor R22a, which are connected in series with the second NMOS transistor N22 connected in parallel with the fifth resistor R22b, which are connected in series with the sixth resistor R22c, between the output terminal of the voltage divider circuit 14-2 and the ground terminal. In this example, at least one of the first through sixth resistors may be omitted.

The control signal generator circuit 13-2 includes a precharge-command delay unit 131-2 and a resistor-control-signal generating unit 132-2, and the resistor-control-signal generating unit 132-2 includes a comparison-signal detecting unit 132-21 and an up/down-signal generating unit 132-22. In this example, the control signal generator circuit 13-2 may generate a first pull-up signal UP21, a second pull-up signal UP22, a first pull-down signal DN21, and a second pull-down signal DN22 as the resistor control signals CS. The first pull-up signal UP21 is applied to a gate of the first PMOS transistor P21 of the first resistor unit L21 and the second pull-up signal UP22 is applied to a gate of the second PMOS transistor P22 of the first resistor unit L21. The first pull-down signal DN21 is applied to a gate of the first NMOS transistor N21 of the second resistor unit L22 and the second pull-down signal DN22 is applied to a gate of the second NMOS transistor N22 of the second resistor unit L22.

The resistance value of the first resistor unit L21 and the resistance value of the second resistor unit L22 are determined on the basis of the first pull-up signal UP21, the second pull-up signal UP22, the first pull-down signal DN21, and the second pull-down signal DN22. As a result, the second voltage V2 to be output from the voltage divider circuit 14-2 is determined. The level of the internal array voltage VINTA to be output from the internal voltage driver 12 rises or drops on the basis of the second voltage V2.

The operation of the control signal generator circuit 13-2 generating the first pull-up signal UP21, the second pull-up signal UP22, the first pull-down signal DN21, and the second pull-down signal DN22 will now be described with reference to FIGS. 6 to 10.

Figure 7:
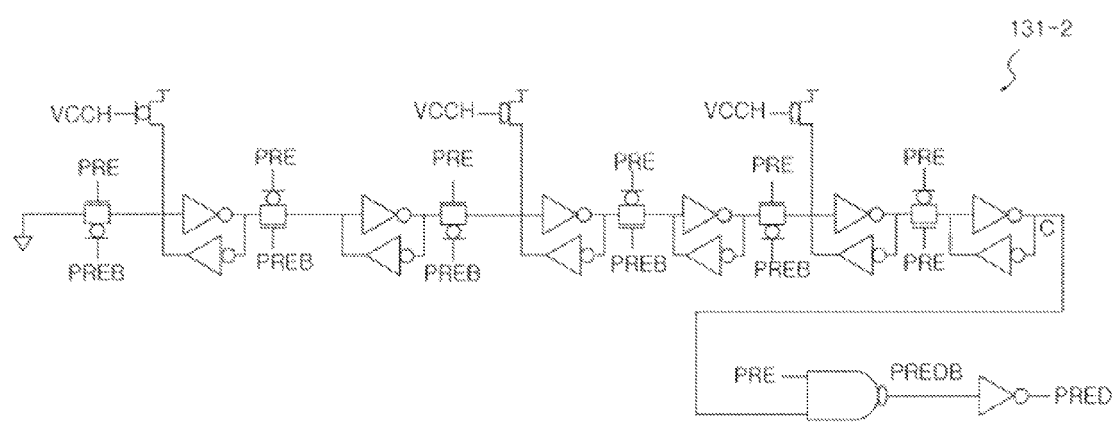
FIG. 7 is a circuit diagram illustrating an example of a precharge-command delay unit shown in FIG. 6, according to one embodiment.
Figure 8:
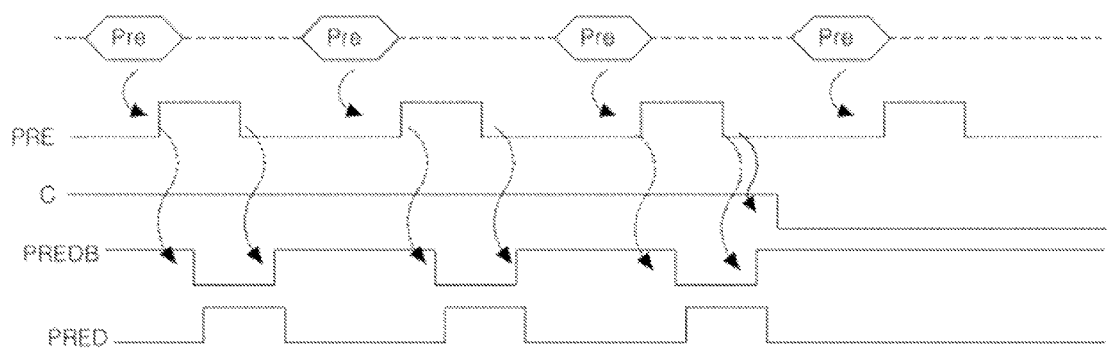
FIG. 8 is a timing chart illustrating the operation of the precharge-command delay unit shown in FIG. 7, according to one embodiment.

Referring to FIG. 6, the control signal generator circuit 13-2 receives the precharge command PRE and receives the comparison signal Vout from the comparator 11-2. Specifically, after the external voltage is applied, during each of three operation cycles, the precharge command PRE is applied to the precharge-command delay unit 131-2 of the control signal generator circuit 13-2. The precharge-command delay unit 131-2 temporarily stores the precharge command PRE and outputs the inverted delayed precharge command PREDB and the non-inverted delayed precharge command PRED to the resistor-control-signal generating unit 132-2. An example of the precharge-command delay unit 131-2 is shown in FIG. 7. FIG. 8 is a timing chart illustrating the operation of the precharge-command delay unit 131-2. As can be seen in FIG. 8, after the external voltage is applied, after three operation cycles end, the level of a signal on a node C of FIG. 7 transitions to a low level. Therefore, the inverted delayed precharge command PREDB and the non-inverted delayed precharge command PRED are prevented from toggling thereafter.

The comparison-signal detecting unit 132-21 of the control signal generator circuit 13-2 receives the comparison signal Vout, and based on Vout and the state of the precharge command delay unit 131-2, outputs the pull-up detection signals PUP21-23, and the pull-down detection signals PDN21-23. An example of the comparison-signal detecting unit 132-21 is shown in FIG. 9.

Hereinafter, for ease of explanation, three operation cycles after the external voltage is applied are referred to as a first operation cycle, a second operation cycle, and a third operation cycle in order of time. In FIG. 9, in one embodiment, during a first operation cycle, a first pull-up detection signal PUP21 and a first pull-down detection signal PDN21 represent an inverted signal of the comparison signal Vout detected on the basis of the precharge command PRE applied in the first operation cycle. Further, during a second operation cycle, a second pull-up detection signal PUP22 and a second pull-down detection signal PDN22 represent an inverted signal of the comparison signal Vout detected on the basis of the precharge command PRE applied in the second operation cycle. Furthermore, during a third operation cycle, a third pull-up detection signal PUP23 and a third pull-down detection signal PDN23 represent an inverted signal of the comparison signal Vout detected on the basis of the precharge command PRE applied in the third operation cycle.

Figure 9:
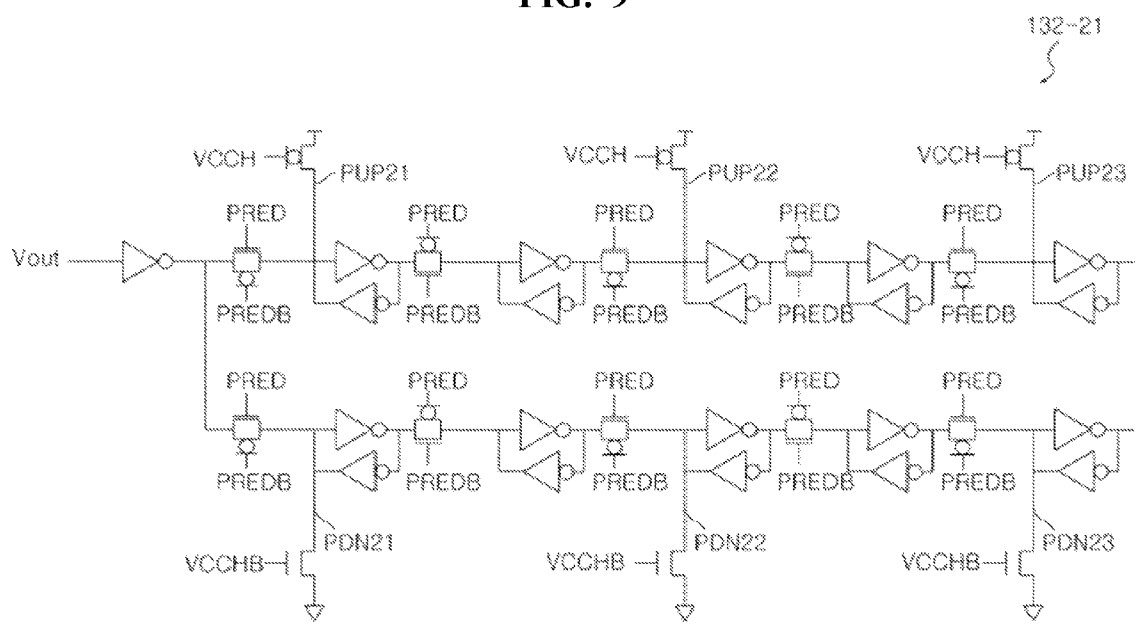
FIG. 9 is a circuit diagram illustrating an example of a comparison-signal detecting unit shown in FIG. 6, according to one embodiment.

As shown in FIG. 9, PMOS transistors are connected between an external voltage application terminal and output terminals of the first to third pull-up detection signals PUP21 to PUP23. When the external voltage is initially applied, a first signal VCCH applied to gates of the PMOS transistors transitions from a high level to a low level and remains temporarily low to temporarily turn on the PMOS transistors so that the first to third pull-up detection signals PUP21 to PUP23 have initial high values. Moreover, NMOS transistors are connected between a ground terminal and output terminals of the first to third pull-down detection signals PDN21 to PDN23. A second signal having the opposite level to the first signal VCCH is applied to gates of the NMOS transistors. When the external voltage is initially applied, the second signal VCCHB applied to gates of the NMOS transistors transitions from a low level to a high level and temporarily remains high to temporarily turn on the NMOS transistors so that the first to third pull-down detection signals PDN21 to PDN23 have initial low values.

The up/down-signal generating unit 132-22 generates the first and second pull-up signals UP21 and UP22 and the first and second pull-down signals DN21 and DN22 by using the first to third pull-up detection signals PUP21 to PUP23 and the first to third pull-down detection signals PDN21 to PDN23.

Figure 10:
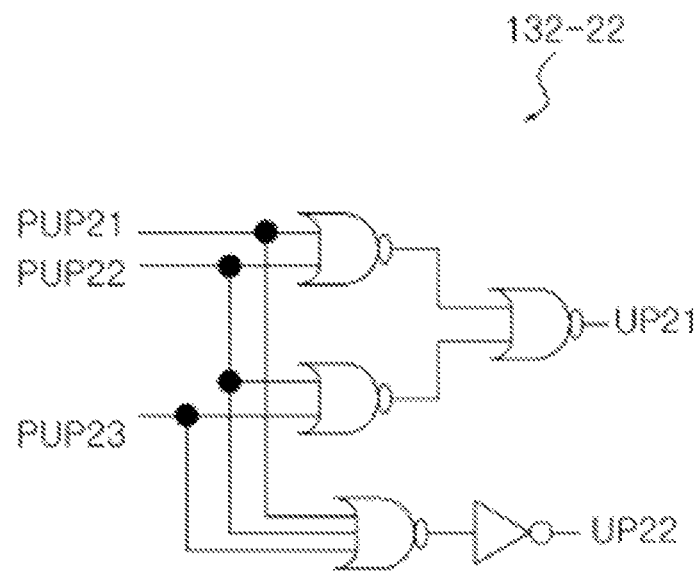
FIG. 10 is a circuit diagram illustrating an example of the up/down-signal generating unit shown in FIG. 6, according to one embodiment.
Figure 10:
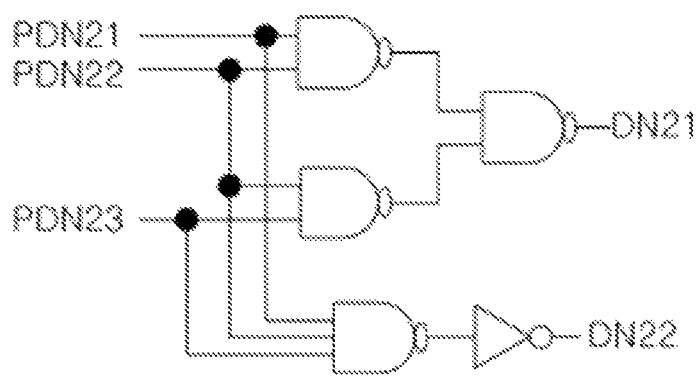

The up/down-signal generating unit 132-22 may be configured to output resistor control signals CS to lower the level of the internal array voltage VINTA when at least consecutive two of the first to third pull-up detection signals PUP21 to PUP23 have the low level (e.g., UP21 and/or UP22 are low), and to output resistor control signals CS to raise the level of the internal array voltage VINTA to be output from the internal voltage driver 12 when at least consecutive two of the first to third pull-down detection signals PDN21 to PDN23 have the high level (e.g., DN21 and/or DN22 are high). FIG. 10 is a circuit diagram illustrating an example of the up/down-signal generating unit 132-22. The up/down-signal generating unit 132-22 having a configuration shown in FIG. 10 receives the first to third pull-up detection signals PUP21 to PUP23 and the first to third pull-down detection signals PDN21 to PDN23 and outputs the first pull-up signal UP21, the second pull-up signal UP22, the first pull-down signal DN21, the second pull-down signal DN22. When at least consecutive two of the first pull-up detection signal PUP21, the second pull-up detection signal PUP22, and the third pull-up detection signal PUP23 have the low level, at least one of the first pull-up signal UP21 and the second pull-up signal UP22 has a low level. Therefore, at least one of a first PMOS transistor P21 and a second PMOS transistor P22 of a first resistor unit L21 is turned on and both of a first NMOS transistor N21 and a second NMOS transistor N22 of the second resistor unit L22 is turned off. As a result, the level of the internal array voltage VINTA to be output from the internal voltage driver 12 drops.

A case in which consecutive two of the first to third pull-up detection signals PUP21 to PUP23 have the low level and another case in which all of the first to third pull-up detection signals PUP21 to PUP23 have the low level will be described below.

When only the first pull-up detection signal PUP21 and the second pull-up detection signal PUP22 have the low level, or when only the second pull-up detection signal PUP22 and the third pull-up detection signal PUP23 have the low level, the first pull-up signal UP21 has the low level. At this time, the second pull-up signal UP22 has the high level and the first pull-down signal DN21 and the second pull-down signal DN22 have the low level.

Consequently, when only consecutive two of the first pull-up detection signal PUP21, the second pull-up detection signal PUP22, and the third pull-up detection signal PUP23 have the low level, only the first PMOS transistor P21 of FIG. 6 is turned on. As a result, V2 increases, which causes Vout to increase, and the level of the internal array voltage VINTA to be output from the internal voltage driver 12 drops to a first level.

When all of the first pull-up detection signal PUP21, the second pull-up detection signal PUP22, and the third pull-up detection signal PUP23 have the low level, both of the first pull-up signal UP21 and the second pull-up signal UP22 have the low level. At this time, the first pull-down signal DN21 and the second pull-down signal DN22 have the low level.

In brief, when all of the first to third pull-up detection signals PUP21 to PUP23 have the low level, both of the first PMOS transistor P21 and the second PMOS transistor P22 are turned on. Therefore, V2 increases more than when only one of P21 and P22 are turned on, which causes Vout to increase more as well, and so the level of the internal array voltage VINTA to be output from the internal voltage driver 12 drops to a second level. The second level is lower than the first level.

As can seen from FIG. 10, when at least consecutive two of the first pull-down detection signal PDN21, the second pull-down detection signal PDN22, and the third pull-down detection signal PDN23 have the high level, at least one of the first NMOS transistor N21 and the second NMOS transistor N22 of the second resistor unit L22 is turned on and both of the first PMOS transistor P21 and the second PMOS transistor P22 of the first resistor unit L21 are turned off. As a result, the level of the internal array voltage VINTA to be output from the internal voltage driver 12 increases.

A case in which consecutive two of the first to third pull-down detection signals PDN21 to PDN23 have the high level and another case in which all of the first to third pull-down detection signals PDN21 to PDN23 have the high level will be described below.

When only the first pull-down detection signal PDN21 and the second pull-down detection signal PDN22 have the high level, or when only the second pull-down detection signal PDN22 and the third pull-down detection signal PDN23 have the high level, the first pull-down signal DN21 has the high level. At this time, the second pull-down signal DN22 has the low level and the first pull-up signal UP21 and the second pull-up signal UP22 have the high level.

In brief, when only consecutive two of the first pull-down detection signal PDN21, the second pull-down detection signal PDN22, and the third pull-down detection signal PDN23 have the high level, only the first NMOS transistor N21 of FIG. 6 is turned on. As a result, the V2 decreases, which causes Vout to decrease, and the level of the internal array voltage VINTA to be output from the internal voltage driver 12 rises to a third level.

When all of the first pull-down detection signal PDN21, the second pull-down detection signal PDN22, and the third pull-down detection signal PDN23 have the high level, both of the first pull-down signal DN21 and the second pull-down signal DN22 have the high level. At this time, the first pull-up signal UP21 and the second pull-up signal UP22 have the high level.

In brief, when all of the first to third pull-down detection signals PDN21 to PDN23 have the high level, both of the first NMOS transistor N21 and the second NMOS transistor N22 are turned on. Therefore, V2 decreases more than when only one of N21 and N22 are turned on, which causes Vout to decrease more as well, and the level of the internal array voltage VINTA to be output from the internal voltage driver 12 increases to a fourth level. The fourth level is higher than the third level.

Figure 11:
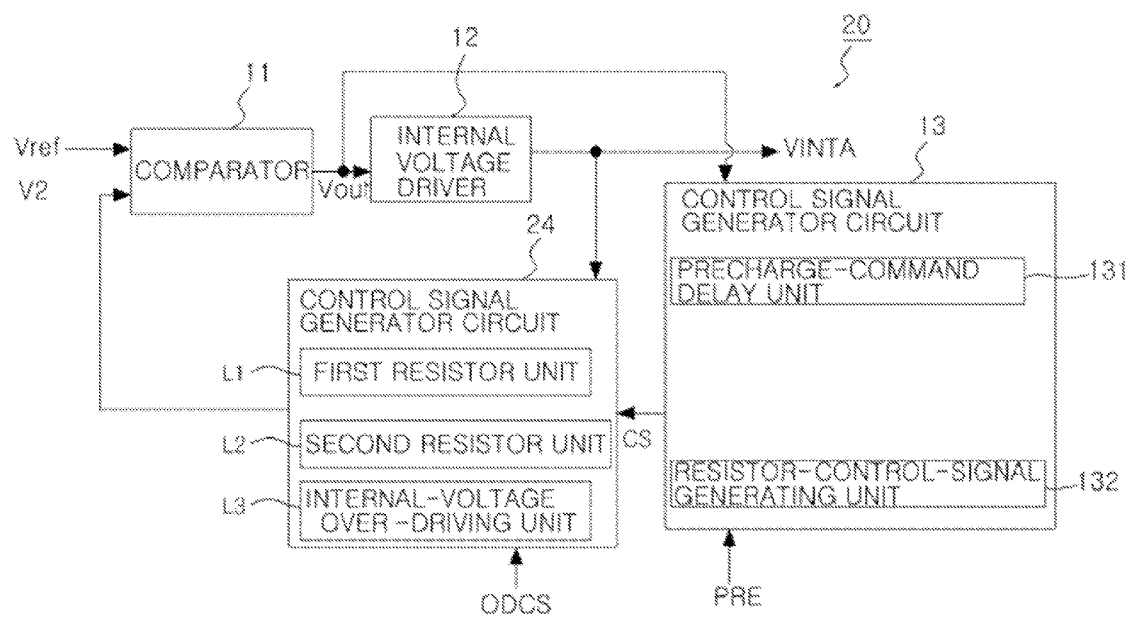
FIG. 11 is a block diagram schematically illustrating an internal voltage generator circuit according to another example embodiment.

FIG. 11 is a block diagram illustrating an internal voltage generator circuit 20 according to another example embodiment. The configuration of this example embodiment is similar to the first example embodiment except that a voltage divider circuit 24 shown in FIG. 11 is applied as an example of the voltage divider circuit 14.

The voltage divider circuit 24 of the internal voltage generator circuit 20 includes a first resistor unit L1 and a second resistor unit L2, similar to the voltage divider circuit 14. Moreover, the voltage divider circuit 24 further includes an internal-voltage over-driving unit L3.

The internal-voltage over-driving unit L3 may be connected in series between the second resistor unit L2 and the ground terminal. The internal-voltage over-driving unit L3 may be composed of an NMOS transistor. When the internal-voltage over-driving unit L3 is composed of an NMOS transistor, an over-driving control signal ODCS is applied to a gate of the NMOS transistor. The over-driving control signal ODCS may be activated at a predetermined time point after an active command is applied and maintained in the active state during a predetermined time period. The internal-voltage over-driving unit L3 is applicable to the examples shown in FIGS. 2 and 6.

Figure 12:
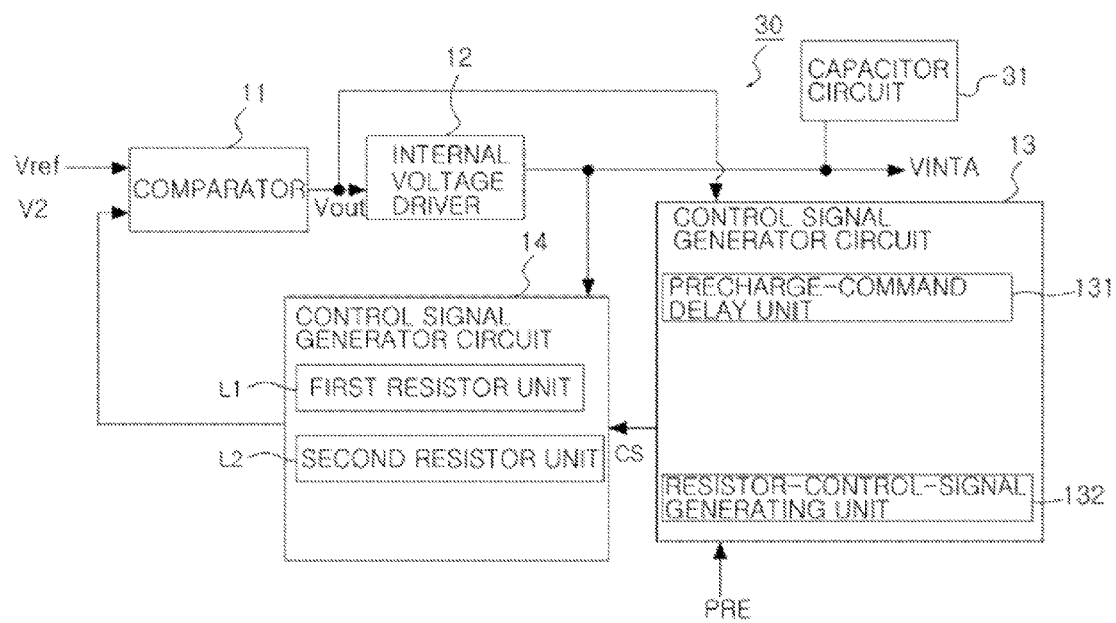
FIG. 12 is a block diagram schematically illustrating an internal voltage generator circuit according to a further example embodiment.

FIG. 12 shows an internal voltage generator circuit 30 according to yet another example embodiment. The configuration of this example embodiment is similar to the first example embodiment described above, except that a capacitor circuit 31 is added to the output terminal of internal voltage driver 12.

The capacitor circuit is for preventing minute swing of the level of the internal array voltage VINTA to be output from the internal voltage driver 12. The capacitor circuit is applicable to the examples shown in FIGS. 2 and 6.

Figure 13:
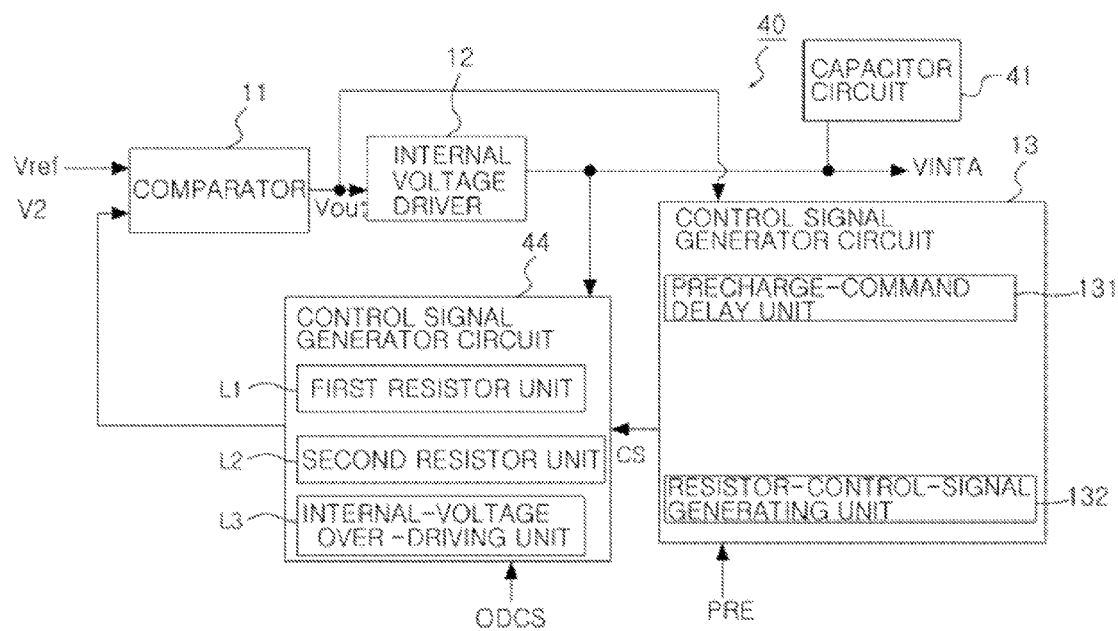
FIG. 13 is a block diagram schematically illustrating an internal voltage generator circuit according to another example embodiment.

FIG. 13 shows an internal voltage generator circuit 40 according to another example embodiment. The configuration of this example embodiment is similar to the first example embodiment described above, except that a voltage divider circuit 44 further including an internal-voltage over-driving unit L3 is applied as an example of the voltage divider circuit 14 and a capacitor circuit 41 is added to the output terminal of the internal voltage driver 12.

The voltage divider circuit 44 of the internal voltage generator circuit 40 includes a first resistor unit L1 and a second resistor unit L2, similar to the voltage divider circuit 14. Moreover, the voltage divider circuit 44 further includes an internal-voltage over-driving unit L3.

The internal-voltage over-driving unit L3 may be connected in series between the second resistor unit L2 and the ground terminal. The internal-voltage over-driving unit L3 may be composed of an NMOS transistor. When the internal-voltage over-driving unit L3 is composed of an NMOS transistor, an over-driving control signal ODCS is applied to a gate of the NMOS transistor. The over-driving control signal ODCS may be activated at a predetermined time point after an active command is applied and maintained in the active state during a predetermined time period.

The capacitor circuit 41 is for preventing minute swing of the level of the internal array voltage VINTA to be output from the internal voltage driver 12.

Figure 14:
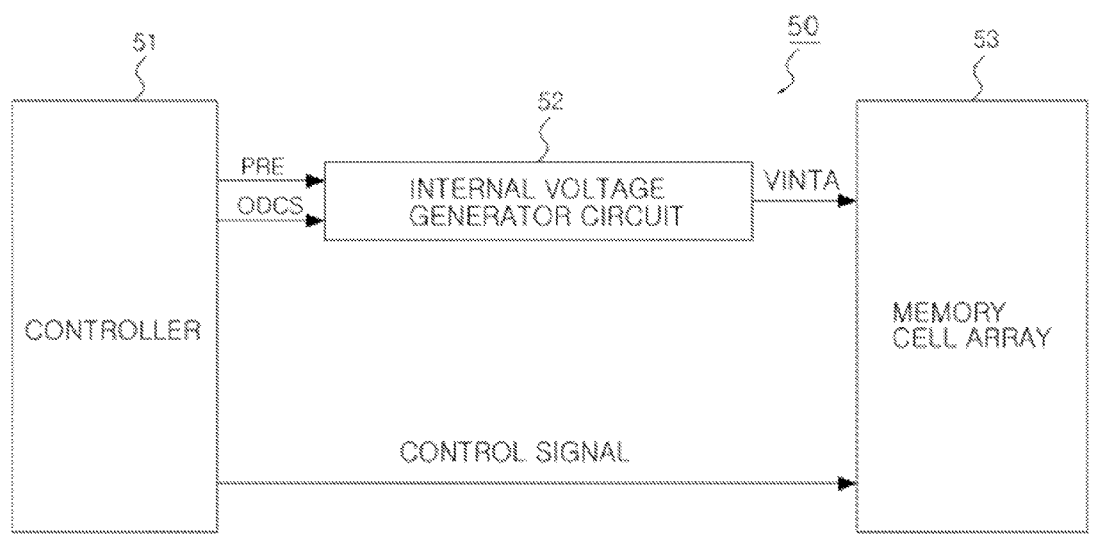
FIG. 14 is a block diagram schematically illustrating an internal voltage generator circuit according to another example embodiment.

FIG. 14 shows a semiconductor memory device 50 according to another example embodiment.

A semiconductor memory device according to the embodiment of FIG. 14 includes a controller 51, an internal voltage generator circuit 52, and a memory cell array 53 as shown in FIG. 14.

The internal voltage generator circuit 52 receives control signals such as a precharge command PRE and an over-driving control signal ODCS and outputs an internal array voltage VINTA to the memory cell array 53. The internal voltage generator circuit 52 may have a configuration according to any one of the example embodiments described above.

The memory cell array 53 may include one or more memory cell blocks and an internal array voltage VINTA to be applied to each memory cell block may be separately controlled.

As described above, according to the example embodiments, it is possible to control a variation in the level of an internal array voltage by controlling a resistance ratio between a first resistor unit and a second resistor unit constituting a voltage divider circuit.

Moreover, since it is possible to maintain an internal array voltage constantly after charging bit lines are completed, it is possible to improve the performance of a semiconductor memory device.

In the drawings and specification, there have been described different embodiments and, although specific terms are employed, they are used in a generic and descriptive sense only and not for limitation, the inventive scope being set forth in the following claims. For example, the internal voltage generator circuit described above may be used for generating internal voltages for circuit elements other than a memory array, such as for circuit elements of a microprocessor or other integrated circuit device that undergo operation cycles. In addition, the configuration of the control circuit or the internal connection described herein structure may be modified without deviating from the intent of the embodiments described above.

What is claimed is:
1. An internal voltage generator circuit comprising:
    a comparator configured to compare a first voltage with a reference voltage and to output a comparison signal;
    an internal voltage driver configured to receive an external voltage and the comparison signal and to output an internal voltage at an internal voltage output terminal, based on the comparison signal;

a voltage divider circuit including first and second resistor units and a first voltage output terminal between the first and second resistor units, configured to receive the internal voltage, and configured to output the first voltage based on resistance values of the first and second resistor units, the first and second resistor units connected in series, and the first voltage being output through the first voltage output terminal; and a control signal generator circuit configured to generate at least one resistor control signal for controlling the resistance value of the first resistor unit and at least one resistor control signal for controlling the resistance value of the second resistor unit, on the basis of the comparison signal and a precharge command.

2. The internal voltage generator circuit of claim 1, wherein:

the control signal generator circuit is configured to output, during at least a first operation cycle, control signals that cause the resistance values of the first and second resistor units to remain the same as compared to respective initial values, and to output, during subsequent operation cycles, control signals that cause the resistance values of at least one of the first and second resistor units to change as compared to the respective initial values.

3. The internal voltage generator circuit of claim 2, wherein the control signal generator circuit comprises:

a precharge-command delay unit configured to receive the precharge command during the at least first operation cycle and to output a delayed precharge command; and a resistor-control-signal generator configured to receive the comparison signal and to generate the at least one resistor control signal for the first resistor unit and the at least one resistor control signal for the second resistor unit on the basis of the received comparison signal.

4. The internal voltage generator circuit of claim 1, wherein:

the first resistor unit comprises at least one PMOS transistor connected in parallel with at least a first resistor and in series with at least a second resistor, the second resistor unit comprises at least one NMOS transistor connected in parallel with at least a third resistor and in series with at least a fourth resistor, the number of PMOS transistors of the first resistor unit is the same as the number of NMOS transistors of the second resistor unit, each of the at least one first resistor control signal is applied to a gate of a corresponding PMOS transistor, and each of the at least one second resistor control signal is applied to a gate of a corresponding NMOS transistor.

5. The internal voltage generator circuit of claim 4, wherein:

when the number of PMOS transistors is 1,
the control signal generator circuit is configured to:
initially receive an external voltage;
receive a first precharge command during a first operation cycle after the external voltage is applied and output a first resistor control signal for the first resistor unit and a first resistor control signal for the second resistor unit in response; and
receive a second precharge command during a second operation cycle after the first operation cycle and output a second resistor control signal for the first resistor unit and a second resistor control signal for the second resistor unit in response, wherein
the first resistor control signals do not cause the resistance of the voltage divider circuit to change; and
the second resistor control signals cause the resistance of the voltage divider circuit to change.

6. The internal voltage generator circuit of claim 4, wherein:

when the number of PMOS transistors is N equal to or larger than 2,
the control signal generator circuit is configured to:
initially receive an external voltage;
receive a first through N+1th precharge command during (N+1) operation cycles,
output resistor control signals during the first through Nth precharge commands that cause the resistance values of the first and second resistor units to remain the same as compared to the respective initial values, and
output resistor control signals during the N+1th operation cycle that cause the resistance values of at least one of the first and second resistor units to change as compared to the respective at least one initial value.

7. The internal voltage generator circuit of claim 1, wherein:

the voltage divider circuit further comprises an internal-voltage over-driving unit, and the internal-voltage over-driving unit is connected between the second resistor unit and a ground terminal in series, is activated at a predetermined time point after an active command is applied, and maintains an active state during a predetermined time period.

8. The internal voltage generator circuit of claim 7, wherein the internal-voltage over-driving unit comprises an NMOS transistor.

9. The internal voltage generator circuit of claim 1, further comprising:

a capacitor circuit connected to the internal voltage output terminal to prevent minute swing of the internal voltage.

10. A semiconductor memory device comprising: a memory cell array; a controller configured to output a precharge command; and an internal voltage generator circuit configured to receive an external voltage and to output an internal voltage, and comprising:

a comparator configured to compare a first voltage with a reference voltage and to output a comparison signal;

an internal voltage driver configured to receive the external voltage and the comparison signal and to output the internal voltage through an internal voltage output terminal to the memory cell array, based on the comparison signal;

a voltage divider circuit including first and second resistor units and a first voltage output terminal between the first and second resistor units, configured to receive the internal voltage, and configured to output the first voltage based on resistance values of the first and second resistor units, the first and second resistor units connected in series, and the first voltage being output through the first voltage output terminal; and a control signal generator circuit configured to generate at least one resistor control signal for controlling the resistance value of the first resistor unit and at least one resistor control signal for controlling the resistance value of the second resistor unit, on the basis of the comparison signal and the precharge command.

11. The semiconductor memory device of claim 10, wherein:

the control signal generator circuit is configured to output, during at least a first operation cycle, control signals that cause the resistance values of the first and second resistor units to remain the same as compared to respective initial values, and to output, during subsequent operation cycles, control signals that cause the resistance values of at least one of the first and second resistor units to change as compared to the respective initial values.

12. The semiconductor memory device of claim 11, wherein the control signal generator circuit comprises:
a precharge-command delay unit configured to receive the precharge command during the at least first operation cycle and to output a delayed precharge command; and
a resistor-control-signal generator configured to receive the comparison signal and to generate the at least one resistor control signal for the first resistor unit and the at least one resistor control signal for the second resistor unit on the basis of the received comparison signal.

13. The semiconductor memory device of claim 12, wherein:
the first resistor unit comprises at least one PMOS transistor connected in parallel with at least a first resistor,
the second resistor unit comprises at least one NMOS transistor connected in parallel with at least a second resistor,
the number of PMOS transistors of the first resistor unit is the same as the number of NMOS transistors of the second resistor unit,
each of the at least one first resistor control signal is applied to a gate of a corresponding PMOS transistor, and
each of the at least one second resistor control signal is applied to a gate of a corresponding NMOS transistor.

14. The semiconductor memory device of claim 13, wherein:
the first resistor unit further comprises a third resistor connected in series with the at least one PMOS transistor, and
the second resistor unit further comprises a fourth resistor connected in series with the at least one NMOS transistor.

15. The semiconductor memory device of claim 13, wherein:
when the number of PMOS transistors is 1,
the internal voltage generation circuit is configured to cause the first and second resistor units to remain at initial resistance values during a first precharge cycle; and
the internal voltage generation circuit is configured to cause at least one of the first and second resistor units to change to a subsequent resistance value during a subsequent precharge cycle.

16. The semiconductor memory device of claim 11, wherein:
when the first voltage is lower than the reference voltage:
during at least the first operation cycle, the internal voltage increases a first amount in response to the comparison signal; and
during operation cycles subsequent to the at least first operation cycle, the internal voltage increases an amount greater than the first amount in response to the comparison signal.

17. The semiconductor memory device of claim 11, wherein:
when the number of PMOS transistors is N equal to or larger than 2,
the control signal generator is configured to:
initially receive an external voltage;
receive a first through N+1th precharge command during (N+1) operation cycles;
output resistor control signals during the first precharge command that cause the resistance values of the first and second resistor units to remain the same as compared to the initial value; and
output resistor control signals during subsequent precharge commands that cause the resistance values of at least one of the first and second resistor units to change.

18. A method of controlling an internal voltage supplied to a circuit element in a semiconductor device, the method including:
comparing a reference voltage to a voltage divider output voltage, and based on the comparison, outputting a comparison signal to control the internal voltage, wherein:
during a first operational cycle of the semiconductor device, a voltage divider circuit is set to output the voltage divider output voltage based on an initial predetermined voltage divider resistance ratio; and
during at least one operation cycle subsequent to the first operational cycle of the semiconductor device, the voltage divider circuit is set to output a voltage based on an adjusted voltage divider resistance ratio different from the initial predetermined voltage divider resistance ratio.

19. The method of claim 18, further comprising:
adjusting the voltage divider output voltage based on the comparison signal.

20. The method of claim 19, further comprising:
adjusting the voltage divider output by inputting the comparison signal to a control signal generator circuit;
outputting from the control signal generator circuit at least one control signal; and
adjusting the resistance of at least one resistor unit within the voltage divider circuit based on the at least one control signal.

* * * * *